US009947558B2

United States Patent
Xu et al.

(10) Patent No.: US 9,947,558 B2
(45) Date of Patent: Apr. 17, 2018

(54) METHOD FOR CONDITIONING SILICON PART

(71) Applicant: Lam Research Corporation, Fremont, CA (US)

(72) Inventors: Lin Xu, Katy, TX (US); Hong Shih, Walnut, CA (US); Robin Koshy, Fremont, CA (US); John Daugherty, Fremont, CA (US); Satish Srinivasan, Newark, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/235,660

(22) Filed: Aug. 12, 2016

(65) Prior Publication Data

US 2018/0047594 A1    Feb. 15, 2018

(51) Int. Cl.
    *H01L 21/31*     (2006.01)
    *H01L 21/67*     (2006.01)
    *H01L 21/3213*   (2006.01)
    *H01L 21/311*    (2006.01)
    *H01L 21/02*     (2006.01)

(52) U.S. Cl.
    CPC .. *H01L 21/67069* (2013.01); *H01L 21/02123* (2013.01); *H01L 21/31116* (2013.01); *H01L 21/31144* (2013.01); *H01L 21/32137* (2013.01)

(58) Field of Classification Search
    CPC ......... H01L 21/28211; H01L 21/28132; H01L 21/2815; H01J 37/3244; H01J 37/32532

USPC .............. 438/706, 710, 712, 714, 770, 773; 156/345.33, 345.34, 345.35
    See application file for complete search history.

(56) References Cited

U.S. PATENT DOCUMENTS

| | | | |
|---|---|---|---|
| 7,802,539 B2 * | 9/2010 | Bosch ................. | C04B 41/0054 118/723 E |
| 2006/0057853 A1 | 3/2006 | Mehrotra et al. | |
| 2006/0283553 A1 * | 12/2006 | Ma ....................... | C23C 16/4585 156/345.51 |
| 2007/0117399 A1 * | 5/2007 | Del Puppo ........ | H01L 21/32137 438/710 |
| 2013/0040055 A1 * | 2/2013 | Satoh ....................... | C23C 8/36 427/249.15 |

OTHER PUBLICATIONS

Massoud et al., "Thermal Oxidation of Silicon in Dry Oxygen Growth-Rate Enhancement in the Thin Regime" Journal of the Electrochemical Society vol. 132 No. 11. (Nov. 1985): 2685-2693.

* cited by examiner

*Primary Examiner* — Lan Vinh
(74) *Attorney, Agent, or Firm* — Heyer Law Group LLP

(57) ABSTRACT

A method for conditioning and cleaning a silicon part is provided. The silicon part is heated to a temperature of at least 300° C. in the presence of oxygen to form an outer surface of the silicon part into silicon oxide. The silicon part is placed in a wet bath wherein the bath is a solution that selectively etches silicon oxide with respect to silicon.

13 Claims, 6 Drawing Sheets

METHOD FOR CONDITIONING SILICON PART

BACKGROUND

The disclosure relates to a method for conditioning a silicon part. More specifically, the disclosure relates a method for conditioning a silicon part for use in a plasma processing chamber.

In forming semiconductor devices plasma processing chambers are used to process the substrates. Some plasma processing chambers have silicon parts, such as electrodes, showerheads, and edge rings.

SUMMARY

To achieve the foregoing and in accordance with the purpose of the present disclosure, a method for conditioning a silicon part is provided. The silicon part is heated to a temperature of at least 300° C. in the presence of oxygen to form an outer surface of the silicon part into silicon oxide. The silicon part is placed in a wet bath wherein the bath is a solution that selectively etches silicon oxide with respect to silicon.

In another manifestation, a method for conditioning a silicon part is provided. The silicon part is heated to a temperature of at least 300° C. in the presence of oxygen to form an outer surface of the silicon part into silicon oxide. The silicon part is placed in a HF wet bath, wherein the HF bath selectively etches silicon oxide with respect to silicon. The silicon part is installed as part of a plasma processing chamber. A substrate is placed in the plasma processing chamber. A plasma process of the substrate is provided in the plasma processing chamber, wherein the silicon part is exposed to the plasma process.

In another manifestation, a method for conditioning a silicon part is provided. The silicon part is installed as part of a plasma processing chamber. A substrate is placed in the plasma processing chamber. A plasma process of the substrate is provided in the plasma processing chamber, wherein a polymer is deposited on the silicon part. The silicon part is removed from the plasma processing chamber. The silicon part is heated to a temperature of at least 300° C. in the presence of oxygen to form an outer surface of the silicon part into silicon oxide and which removes the deposited polymer. The silicon part is placed in a HF wet bath, wherein the HF bath selectively etches silicon oxide with respect to silicon. The silicon part is installed as part of a plasma processing chamber. A substrate is placed in the plasma processing chamber. A plasma process of the substrate is provided in the plasma processing chamber, wherein the silicon part is exposed to the plasma process.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Figure 1:
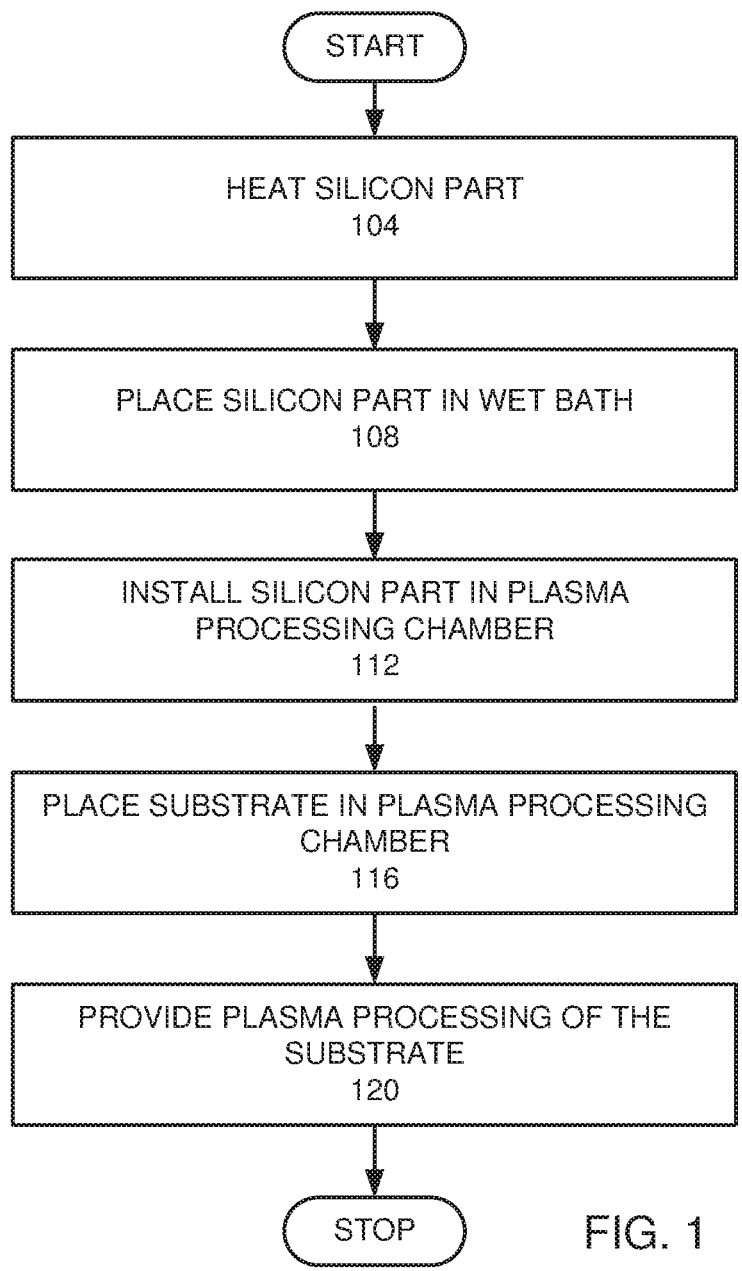
FIG. 1 is a high level flow chart of an embodiment.

FIG. 1 is a high level flow chart of an embodiment. In this embodiment, a silicon part is heated to a temperature of at least 300° C. in the presence of oxygen to form an outer surface of the silicon part into silicon oxide (step 104). The silicon part is placed in a wet bath, where the wet bath is a solution that selectively etches silicon oxide with respect to silicon (step 108). The silicon part is installed in a plasma processing chamber (step 112). A substrate is placed in the plasma processing chamber (step 116). The substrate is subjected to a plasma process in the plasma processing chamber (step 120).

Example

Figure 2:
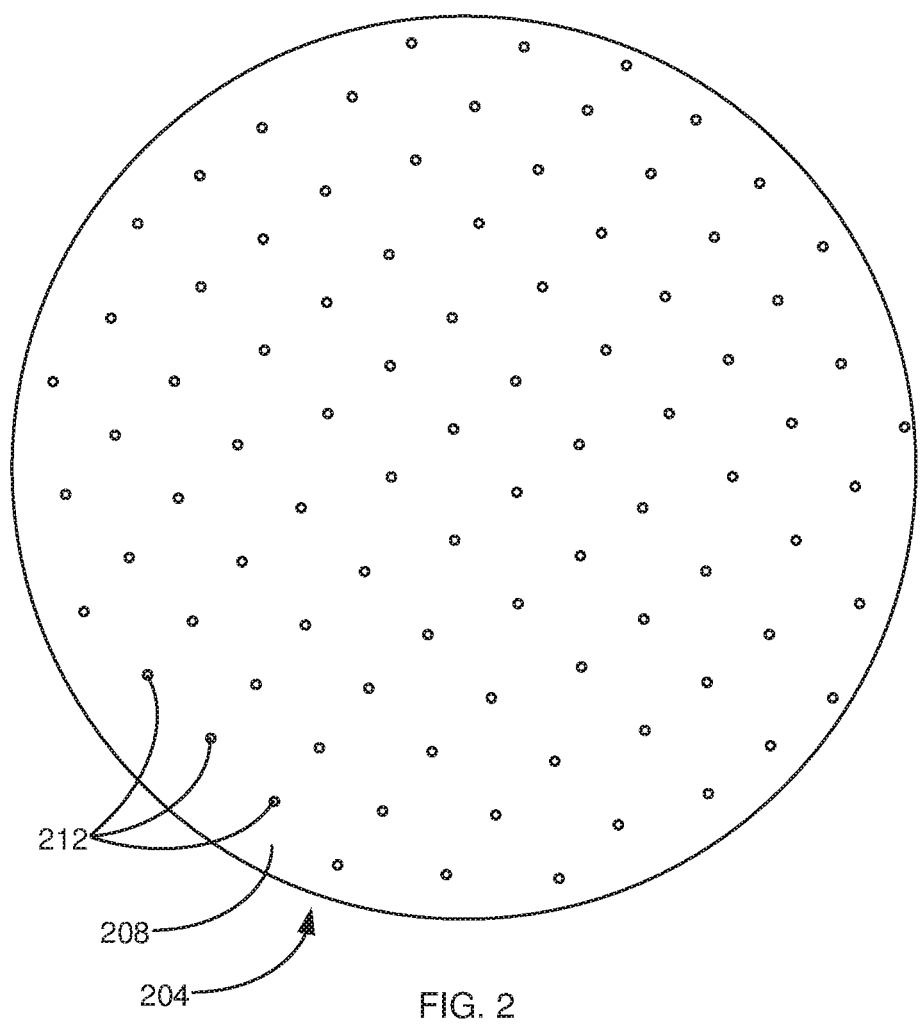
FIG. 2 is a top view of a silicon part used in an embodiment.
Figure 6A:
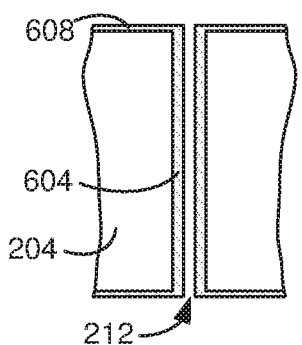
FIGS. 6A-C are enlarged cross-sectional views of the silicon part processed according to an embodiment.

In a preferred embodiment, a silicon part is heated to a temperature of at least 300° C. in the presence of oxygen to form an outer surface of the silicon part into silicon oxide (step 104). FIG. 2 is a top view of a silicon part 204 used in an embodiment. In this embodiment, the silicon part 204 comprises a silicon body 208 in the form of a disk, with a plurality of gas inlet holes 212. The holes 212 are not drawn to scale in order to better illustrate the embodiment. In different embodiments, the holes 212 may have different patterns, such as being arranged in circles. However, the patterns are not related to the working of the embodiment. FIG. 6A is an enlarged cross-sectional view of the silicon part 204 around a gas inlet hole 212. The gas inlet hole 212 was formed using electrical discharge machining (EDM), where a wire electrode locally burns off material by microspark. The formation of the gas inlet hole 212 causes a layer of damage 604 around the gas inlet hole 212. Surface damage 608 to other parts of the silicon part 204 may be caused by other manufacturing processes. In this example the damage 604 created by the formation of the gas inlet hole is greater than, and thicker than, the surface damage 608 of other parts of the silicon part 204 by other processes.

Figure 3:
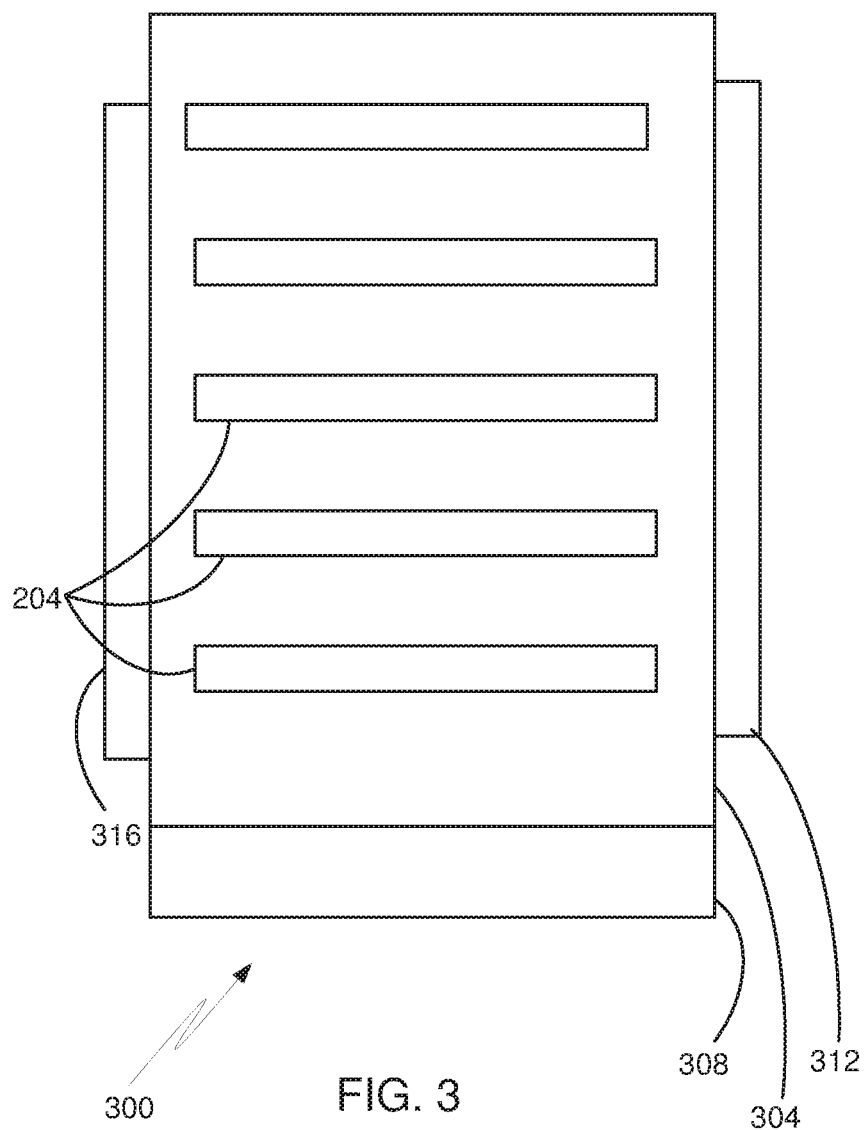
FIG. 3 is a schematic view of an oven used in an embodiment.
Figure 6B:
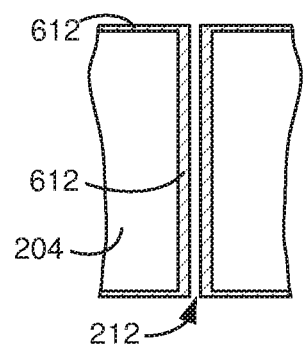

In an embodiment, the heating of the silicon part is done as a batch with a plurality of other silicon parts. FIG. 3 is a schematic view of an oven 300 for heating a plurality of silicon parts 204. The oven 300 has an oven chamber 304, in which a plurality of silicon parts 204 is placed. The oven 300 also has a heater 308, an oxygen source 312, and an exhaust 316. The heater 308 provides heat to the interior of the oven chamber 304, to heat the interior of the oven chamber 304 to a temperature of 800° C. The oxygen source 312 flows oxygen into the oven chamber 304. The exhaust vents gases from the oven chamber 304. The oxygen provided by the oxygen source in this embodiment is $O_2$. The heat and oxygen provided by the oven 300 causes the surface of the silicon part 204 to be transformed from silicon to silicon oxide. A specific example of a thermal treatment recipe is ramping up the temperature at a rate of up to 400° C. per hour until the temperature reaches 800° C., where the temperature is maintained for at least 30 minutes, preferably 4 hr. FIG. 6B is an enlarged cross-sectional view of the silicon part 204 around a gas inlet hole 212 after the heating of the silicon part 204 is completed. The damaged areas on the surface of the silicon part have been oxidized to form silicon oxide 612.

Figure 4:
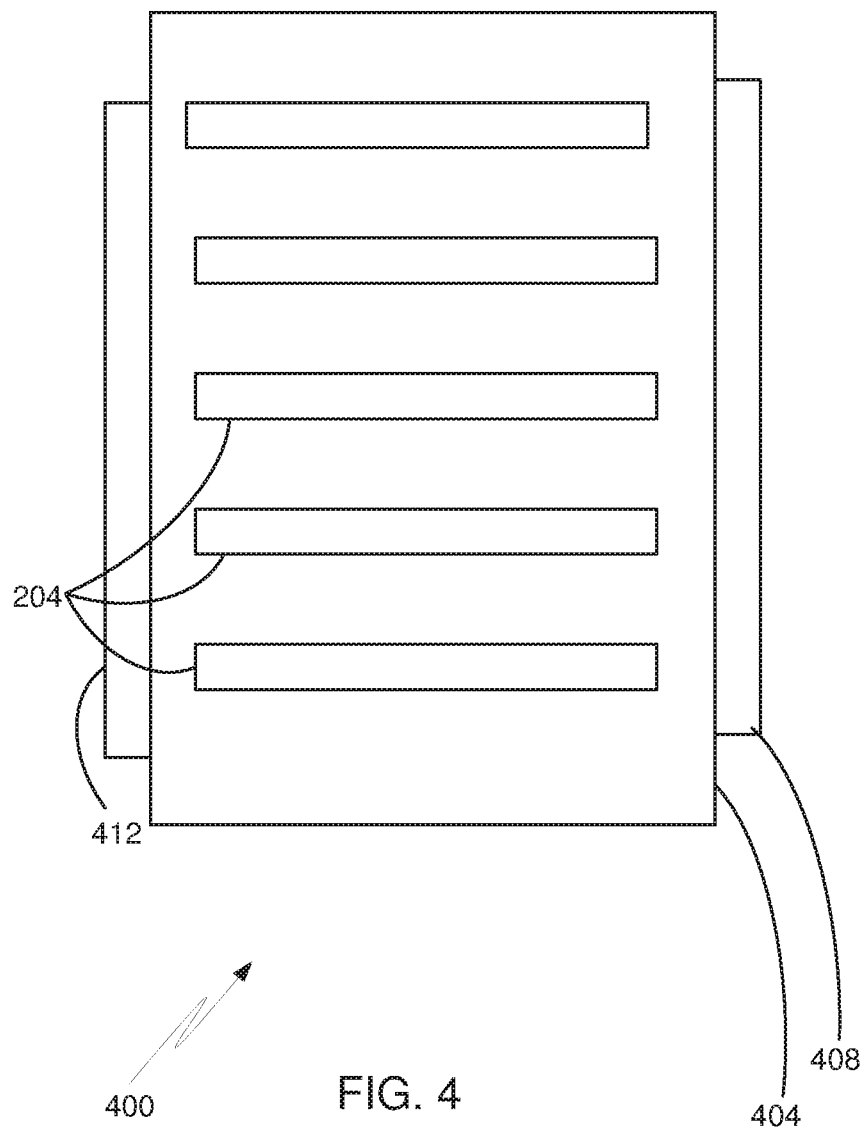
FIG. 4 is a schematic view of a wet bath used in an embodiment.
Figure 6C:
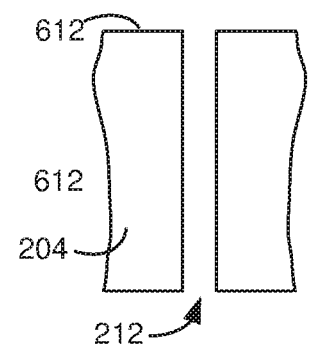

The silicon part is placed in a bath, wherein the bath is a solution that selectively etches silicon oxide with respect to silicon (step 108). FIG. 4 is a schematic view of a wet bath 400. The wet bath 400 has a bath container 404, in which a plurality of silicon parts 204 is placed. A wet bath solution is flowed from a solution source 408 into the bath container 404 and then out to a solution removal system 412. In some embodiments, the bath may be static instead of flowing. Preferably, the bath is a solution consisting essentially of HF in an aqueous solution. In the specification and claims, a bath is defined as being infinitely selective in etching silicon oxide with respect to silicon if the bath is as selective as a solution consisting essentially of HF in an aqueous solution, since such a bath removes silicon oxide with almost no appreciable removal of silicon. The bath consists essentially of a solution of HF and deionized (DI) water at a HF:DI water ratio of 1:10 in wt %. FIG. 6C is an enlarged cross-sectional view of the silicon part 204 around a gas inlet hole 212 after the silicon oxide has been infinitely selectively etched away.

Figure 5:
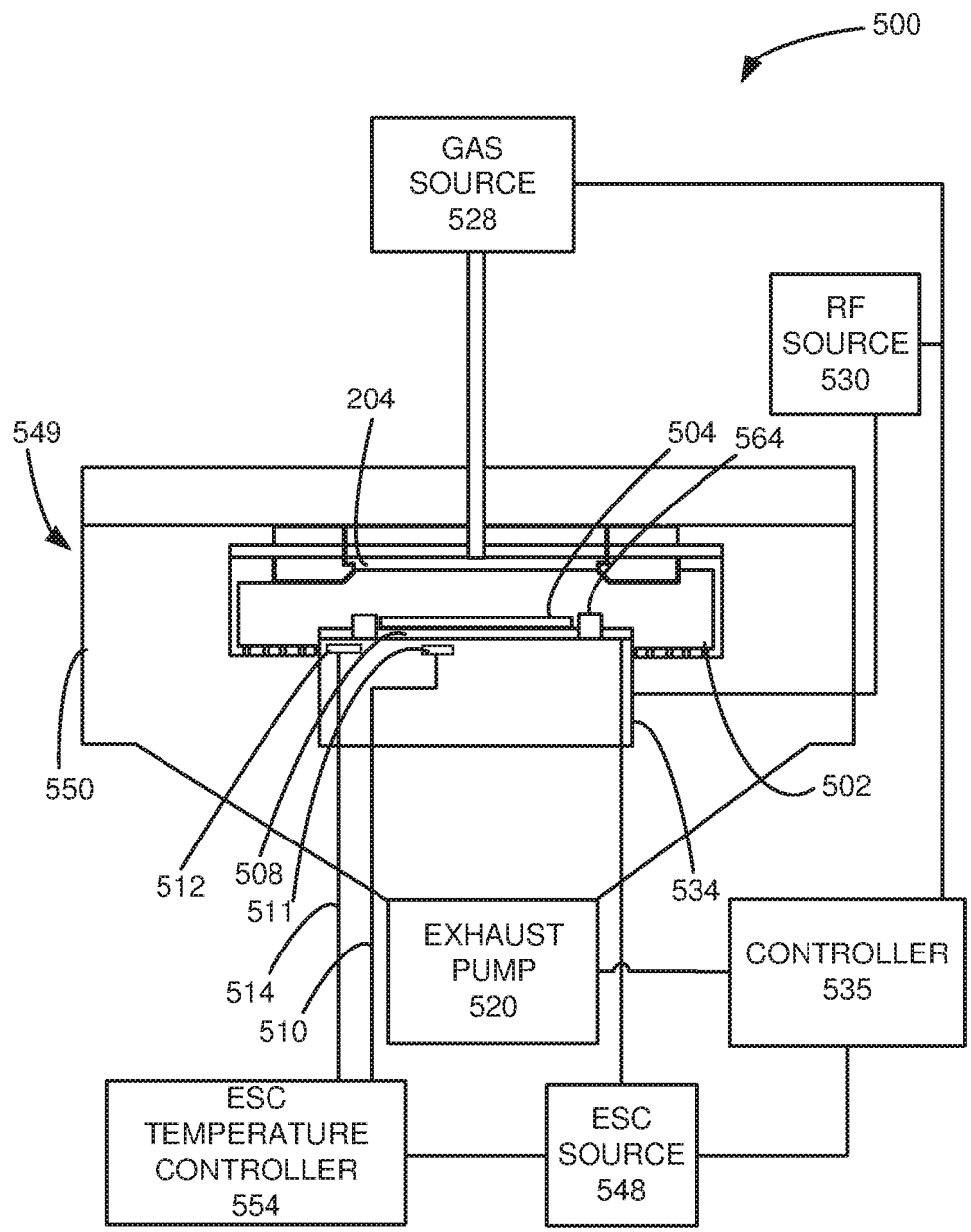
FIG. 5 is a schematic view of an etch reactor that may be used in an embodiment.

The silicon part is installed in a plasma processing chamber (step 112). FIG. 5 is a schematic view of an etch reactor that may be used in an embodiment. In one or more embodiments, an etch reactor 500 comprises a showerhead 204 providing a gas inlet and an ESC 508, within an etch chamber 549, enclosed by a chamber wall 550. Within the etch chamber 549, a substrate 504 on which a stack is formed is positioned on top of the ESC 508. The ESC 508 may provide a bias from the ESC source 548. A gas source 528 is connected to the etch chamber 549 through the showerhead 204. An ESC temperature controller 554 is connected to the ESC 508, and provides temperature control of the ESC 508. In this example, a first connection 510 for providing power to an inner heater 511 for heating an inner zone of the ESC 508 and a second connection 514 for providing to an outer heater 512 for heating an outer zone of the ESC 508. An RF source 530 provides RF power to a lower electrode 534. In this embodiment, the RF source 530 provides power at 2 MHz, 27 MHz, and 60 MHz. In this embodiment, the RF source 530 comprises three RF generators, with one generator at each frequency. In this embodiment, the showerhead 204 is a grounded electrode. In other embodiments, the generators may be in separate RF sources, or separate RF generators may be connected to different electrodes. Other arrangements of RF sources and electrodes may be used in other embodiments. A silicon edge ring 564 is placed around the substrate 504. A Flex® dielectric etch system made by Lam Research Corporation™ of Fremont, Calif. may be used in a preferred embodiment. In this embodiment, one of the showerheads 204 that has been subject to the oven and wet bath is mounted in the etch reactor 500, as shown.

A substrate 504 is placed in the plasma processing chamber, as shown above (step 116). The plasma processing chamber is used to process the substrate (step 120). In this embodiment, the plasma processing chamber, which is the etch reactor 500 is used to etch a stack above the substrate 504.

Silicon electrodes with an array of microholes are widely used in dielectric etch processes to evenly distribute gas. The surface quality of Si electrode, especially the hole surface, is critical to reducing wafer defects to assure device performance. Unstable features within gas holes may get dislodged by high-pressure gas flow and cause wafer defects during processing. Manufacturing a Si electrode with a large number of micro-holes uses electrical discharge machining (EDM), where a wire electrode locally burns off material by micro-spark, which is capable of drilling a large quantity of micro-holes on a production base. However, EDM drilled holes always suffer from hole quality issues, since the EDM process is a violent process involving the re-solidification of molten silicon, causing thermal-induced microcracks and embedded EDM wire materials. Post-drilling treatment is always required to improve hole surface quality. Mixed acid etch (MAE), which uses a mixture of nitric acid, hydrofluoric acid, acetic acid and water, is typically used to remove damaged Si surfaces to improve surface quality and clean the embedded contaminants. Complete removal of unstable structures (overhangs and waffles) from hole surface is very challenging, because: 1) MAE etch is designed for Si etch and the etch endpoint is very difficult to control over hundreds of holes across one electrode and/or across a plurality of electrodes. This causes excess etching of the gas hole by MAE, with high risk of etch process shift, which is unacceptable. 2) MAE etch is a pure liquid process, and a tight control of the etching rate is extremely difficult. For example, many parameters, such as local bath temperature, acid concentration, bath aging, mass transfer in high aspect ratio features, could affect the etch rate and etch rate uniformity. 3) Though the EDM method has great potential to drill much smaller holes, the potential has never been fully realized due to poor control of MAE process, since small fluctuation in the MAE etch rate will become greatly amplified when drilling small size holes.

To improve the hole quality, a honing method (termed DS0) has been developed, where an abrasive wire passes through an undersized hole to locally remove the damage layer from each hole. This method is still not flawless since: 1) this is not a batch process and throughput is low; 2) investment in honing equipment with a precision wire guide system is high; and 3) depending on the choice of the abrasive medium size on the wire, there is still some remaining damage resulting from the honing process especially when using larger grit size.

In this embodiment, the oxidization process will scavenge the poor quality Si surfaces by preferential oxidization of damaged Si surfaces, while the following HF step can completely remove the preferentially oxidized damaged Si surfaces with infinite selectivity over Si underneath. HF overetch is no longer a concern, due to the infinite selectivity of HF, and will not blow up critical dimensions. Furthermore, there is no damage caused by the oxide removal by HF since it is a chemical method. Experiments have shown this reduction of damage, while only ~180 nm of the surface of the Si part is removed by growth of ~400 nm $SiO_2$. In addition, impurities on the surface of the silicon part may be trapped by the oxidation, and removed by the wet bath. Benefits of drilling sub-200 um holes by EDM can be realized, since the removal of damaged Si layer is precise and predictable. Therefore, there is no danger of hole size blow-up using this method.

In another embodiment, the silicon part is first installed in a plasma processing chamber, as shown in FIG. 5. Several substrates are processed in the plasma processing chamber. In this embodiment, a 3D NAND stack of a plurality of layers of silicon oxide and polysilicon (OPOP) is formed over the substrate. The stack is etched. In order to etch such a stack and reduce scalloping, the sidewalls of the etch features must be heavily passivated by depositing a polymer deposition of the sidewalls. The polymer deposition also deposits on surfaces of the plasma processing chamber. In some processes, 5 microns of polymer are deposited in a 30 minute NAND etch process on the hardware in contact with plasma. A plasma clean process may be used to clean most of the deposition on the surfaces in contact with the plasma. However, certain locations in the chamber are not sufficiently cleaned by the plasma cleaning. Such a silicon part may be removed from the plasma processing chamber for further off-chamber cleaning.

Figure 7A:
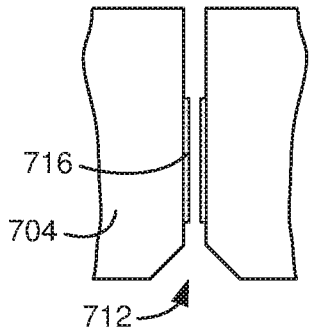
FIGS. 7A-C are enlarged cross-sectional views of the silicon part processed according to another embodiment.

FIG. 7A is an enlarged cross-sectional view of a silicon part 704 in the form of a showerhead with a gas inlet hole 712, after the silicon part has been removed from a plasma processing chamber after a plurality of processes, which coat the silicon part 704 and after a plasma cleaning. Corners of the inlet hole 712 may be faceted during the plasma processing. Polymer deposition 716 remains in the inlet hole 712, since the cleaning plasma is not able to clean the length of such a small inlet hole 712.

Figure 7B:
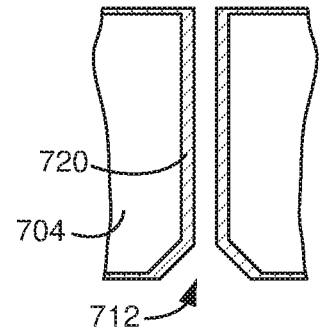

The silicon part is heated to a temperature of at least 300° C. in the presence of oxygen to form an outer surface of the silicon part into silicon oxide (step 104). The same method and system as used in the above embodiment may be used to heat the silicon part. In other embodiments, other methods and systems may be used to heat the silicon part. FIG. 7B is an enlarged cross-sectional view of the silicon part 704 around the gas inlet hole 712 after the heating of the silicon part 704 is completed. The heating has pyrolyzed and gasified the polymer deposition. Simultaneously, damaged areas on the surface of the silicon part 704 and other areas of the surface of the silicon part 704 have been oxidized to form silicon oxide 720.

Figure 7C:
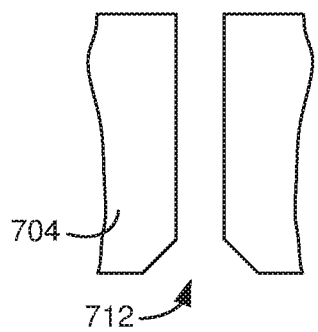

The silicon part is placed in a bath, wherein the bath is a solution that selectively etches silicon oxide with respect to silicon (step 108). The same method and system as used in the above embodiment may be used to selectively etch the silicon oxide. In other embodiments, other methods and systems may be used to selectively etch the silicon oxide on the surface of the silicon part. FIG. 7C is an enlarged cross-sectional view of the silicon part 704 around the gas inlet hole 712 after the silicon oxide has been infinitely selectively etched away.

The silicon part is reinstalled in a plasma processing chamber (step 112). A substrate is placed in the plasma processing chamber (step 116). The substrate is subjected to a plasma process in the plasma processing chamber (step 120).

In some embodiments, the thermal heating and wet bath may be cyclically repeated. In other embodiments, the oxygen that is provided during the oxidation may be in the form of water vapor or a reactive $O_2$ plasma.

In another embodiment, the silicon part is another type of electrode other than a shower head. In another embodiment, the silicon part is a silicon edge ring or a Si C-shroud. The edge ring may surround an outer edge of the substrate. In the specification and claims the silicon part is defined as being at least 99% pure silicon by weight. More preferably, the silicon part is at least 99.99% pure by weight.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method for conditioning a silicon part, comprising:
   heating the silicon part to a temperature of at least 300° C. in the presence of oxygen to form an outer surface of the silicon part into silicon oxide; and
   placing the silicon part in a wet bath wherein the wet bath is a solution that selectively etches silicon oxide with respect to silicon, wherein the wet bath consists essentially of HF and water.

2. The method, as recited in claim 1, wherein the silicon part is a plasma processing chamber silicon showerhead with gas apertures, wherein inner surfaces of the gas apertures are formed into silicon oxide by the heating and wherein the wet bath selectively etches the silicon oxide formed on the inner surfaces of the gas apertures with respect to silicon.

3. The method, as recited in claim 1, wherein the heating of the silicon part pyrolyzes or gasifies polymer deposition on the silicon part.

4. The method, as recited in claim 1, wherein the heating the silicon part to a temperature of at least 300° C., heats the silicon part to a temperature of between 300° C. and 800° C.

5. The method, as recited in claim 1, wherein the silicon part is 99% pure silicon by weight.

6. The method, as recited in claim 1, further comprising adding oxygen while heating the silicon part.

7. The method, as recited in claim 6, wherein the wet bath infinitely selectively etches silicon oxide with respect to silicon.

8. A method for conditioning a silicon part, comprising:
   heating the silicon part to a temperature of at least 300° C. and between 300° C. and 800° C. in the presence of oxygen to form an outer surface of the silicon part into silicon oxide; and
   placing the silicon part in a HF wet bath, wherein the HF wet bath selectively etches silicon oxide with respect to silicon.

9. The method, as recited in claim 8, wherein the silicon part is 99% pure silicon by weight.

10. The method, as recited in claim 8, wherein the silicon part is a plasma processing chamber silicon showerhead with gas apertures, wherein inner surfaces of the gas apertures are formed into silicon oxide by the heating and wherein the wet bath selectively etches the silicon oxide formed on the inner surfaces of the gas apertures with respect to silicon.

11. The method, as recited in claim 8, wherein the heating of the silicon part pyrolyzes or gasifies polymer deposition on the silicon part.

12. The method, as recited in claim 8, further comprising adding oxygen while heating the silicon part.

13. The method, as recited in claim 12, wherein the wet bath infinitely selectively etches silicon oxide with respect to silicon.

\* \* \* \* \*